United States Patent
Nagabhirava et al.

(10) Patent No.: US 9,412,609 B1
(45) Date of Patent: Aug. 9, 2016

(54) HIGHLY SELECTIVE OXYGEN FREE SILICON NITRIDE ETCH

(71) Applicant: Lam Research Corporation, Fremont, CA (US)

(72) Inventors: Bhaskar Nagabhirava, Albany, NY (US); Seongjun Heo, Tainan (TW); Chih-Hsiang Wu, Hsinchu (TW); Ying-Ren Chen, Hsinchu (TW)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/726,044

(22) Filed: May 29, 2015

(51) Int. Cl.
| | |
|---|---|
| H01L 21/3065 | (2006.01) |
| H01L 21/311 | (2006.01) |
| H01L 21/3105 | (2006.01) |
| H01L 21/683 | (2006.01) |

(52) U.S. Cl.
CPC ...... *H01L 21/3065* (2013.01); *H01L 21/30655* (2013.01); *H01L 21/31058* (2013.01); *H01L 21/31105* (2013.01); *H01L 21/31116* (2013.01); *H01L 21/31144* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 866,835 | A * | 9/1907 | Indrakanti | E06B 9/54 160/22 |
| 5,683,538 | A * | 11/1997 | O'Neill | B24B 37/013 156/345.28 |
| 8,668,835 | B1 | 3/2014 | Indrakanti et al. | |
| 2012/0077347 | A1 * | 3/2012 | Metz | H01L 21/76897 438/715 |

* cited by examiner

*Primary Examiner* — Jiong-Ping Lu
(74) *Attorney, Agent, or Firm* — Beyer Law Group LLP

(57) ABSTRACT

A method for selectively etching silicon nitride with respect to silicon oxide is provided. An oxygen free silicon nitride etch gas comprising $H_2$ and either $CF_4$ or $C_XH_YF_Z$ ($X \geq 1$, $Y \geq 1$, $Z \geq 1$) is provided. An RF power is provided to form the etch gas into a plasma, wherein the silicon nitride is exposed to the plasma.

13 Claims, 5 Drawing Sheets

US 9,412,609 B1

HIGHLY SELECTIVE OXYGEN FREE SILICON NITRIDE ETCH

BACKGROUND OF THE INVENTION

The present invention relates to etching a layer through a mask during the production of a semiconductor device. More specifically, the present invention relates to a highly selective oxygen free silicon nitride etch.

During semiconductor wafer processing, features may be etched into a dielectric layer. In some processes silicon nitride features are selectively etched.

SUMMARY OF THE INVENTION

To achieve the foregoing and in accordance with the purpose of the present invention, a method for selectively etching silicon nitride with respect to silicon oxide is provided. An oxygen free silicon nitride etch gas comprising $H_2$ and either $CF_4$ or $C_XH_YF_Z$ ($X \geq 1, Y \geq 1, Z \geq 1$) is provided. An RF power is provided to form the etch gas into a plasma, wherein the silicon nitride is exposed to the plasma.

In another manifestation of the invention, a method for selectively etching silicon nitride with respect to silicon oxide, wherein the silicon nitride is adjacent to metal features, is provided. An oxygen free silicon nitride etch gas consisting essentially of $H_2$ and $CH_3F$ is provided. An electrostatic chuck is maintained at a temperature between 0° C. and 60° C., inclusive, to maintain a silicon nitride etch profile. A pulsed RF power is provided to form the etch gas into a plasma, wherein the silicon nitride and metal features are exposed to the plasma.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Mixed mode pulsed (MMP) etching is helpful in etching self aligned vias and trenches in a multilayer film stack, as described in U.S. Pat. No. 8,668,835, issued on Mar. 11, 2014, entitled "METHOD OF ETCHING SELF-ALIGNED VIAS AND TRENCHES IN A MULTI-LAYER FILM STACK," by Ananth Indrakanti et al. which is incorporated by reference for all purposes.

Figure 1:
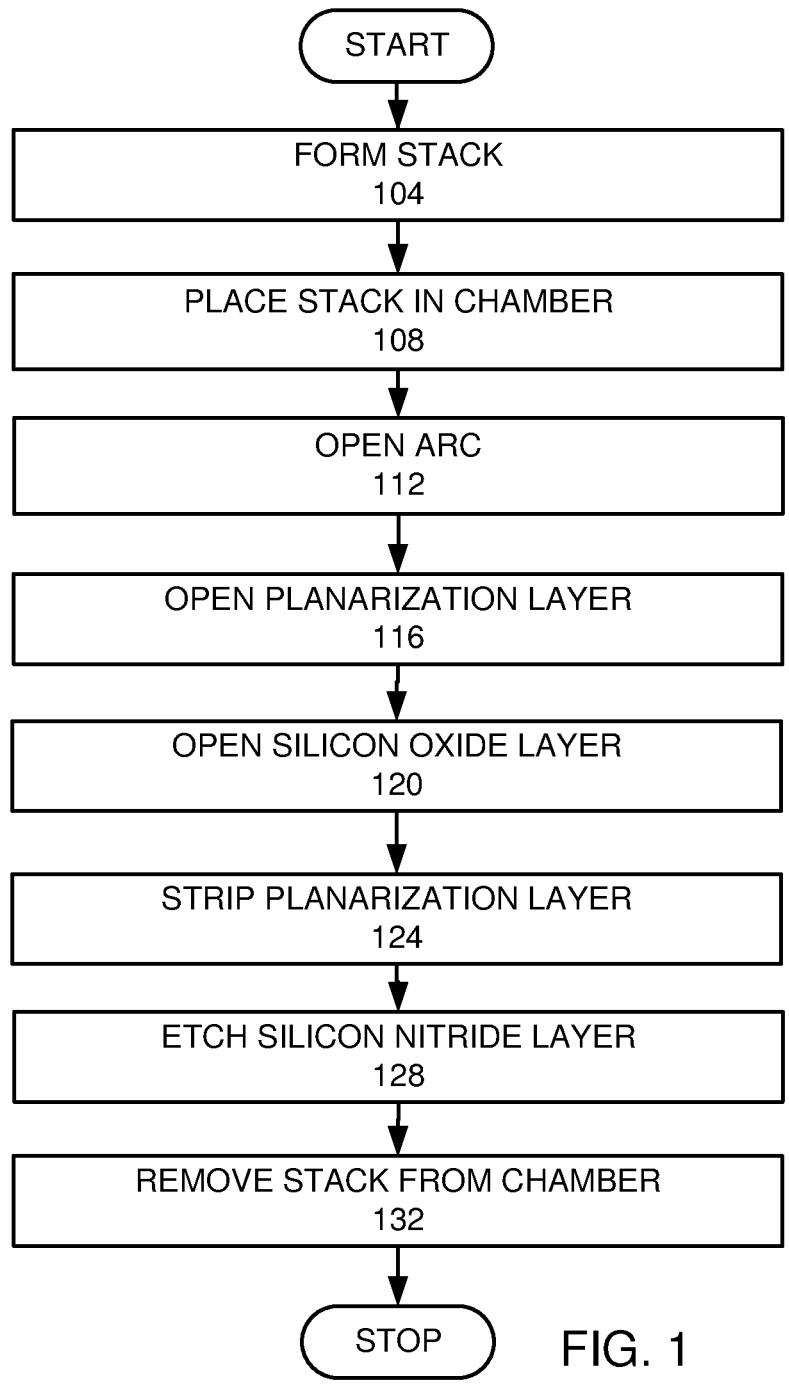
FIG. 1 is a high level flow chart of an embodiment of the invention.

To facilitate understanding, FIG. 1 is a high level flow chart of a process used in an embodiment of the invention. A stack is formed (step 104). The stack is placed in a plasma processing chamber (step 108). An antireflective coating (ARC) is opened (step 112). A planarization layer is opened (step 116). A silicon oxide layer is opened (step 120). The planarization layer is stripped (step 124) A silicon nitride layer is etched (step 128). The stack is removed from the plasma processing chamber (step 132).

EXAMPLES

Figure 2A:
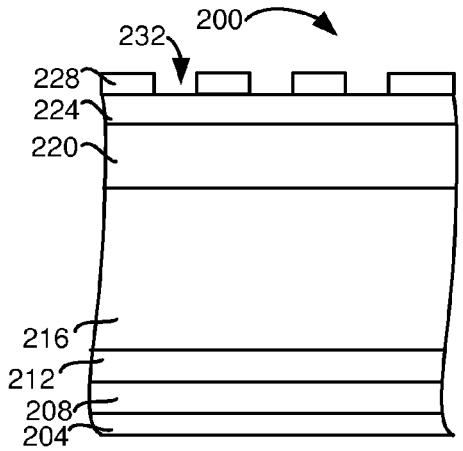
FIGS. 2A-F are schematic views of a stack processed according to an embodiment of the invention.

In an example of the invention, a stack is formed (step 104). FIG. 2A is a cross-sectional view of a stack 200 used in an embodiment of the invention. A substrate 204 is provided. The substrate 204 may be a semiconductor wafer or may be a stack including a wafer. A metal layer 208 is formed over the substrate 204. In this example, the metal layer 208 is copper, cobalt, tungsten, or an alloy of such metals. The metal layer may be patterned. A silicon nitride (SiN) layer 212 is formed over the metal layer 208. A silicon oxide (SiO) containing layer 216 is formed over the SiN layer 212. A planarization layer 220 is formed over the SiO containing layer 216. An antireflective coating (ARC) 220 is formed over the planarization layer 220. A patterned mask 228 with features 232 is formed over the ARC 220. In this embodiment, the mask 228 is of photoresist.

Figure 3:
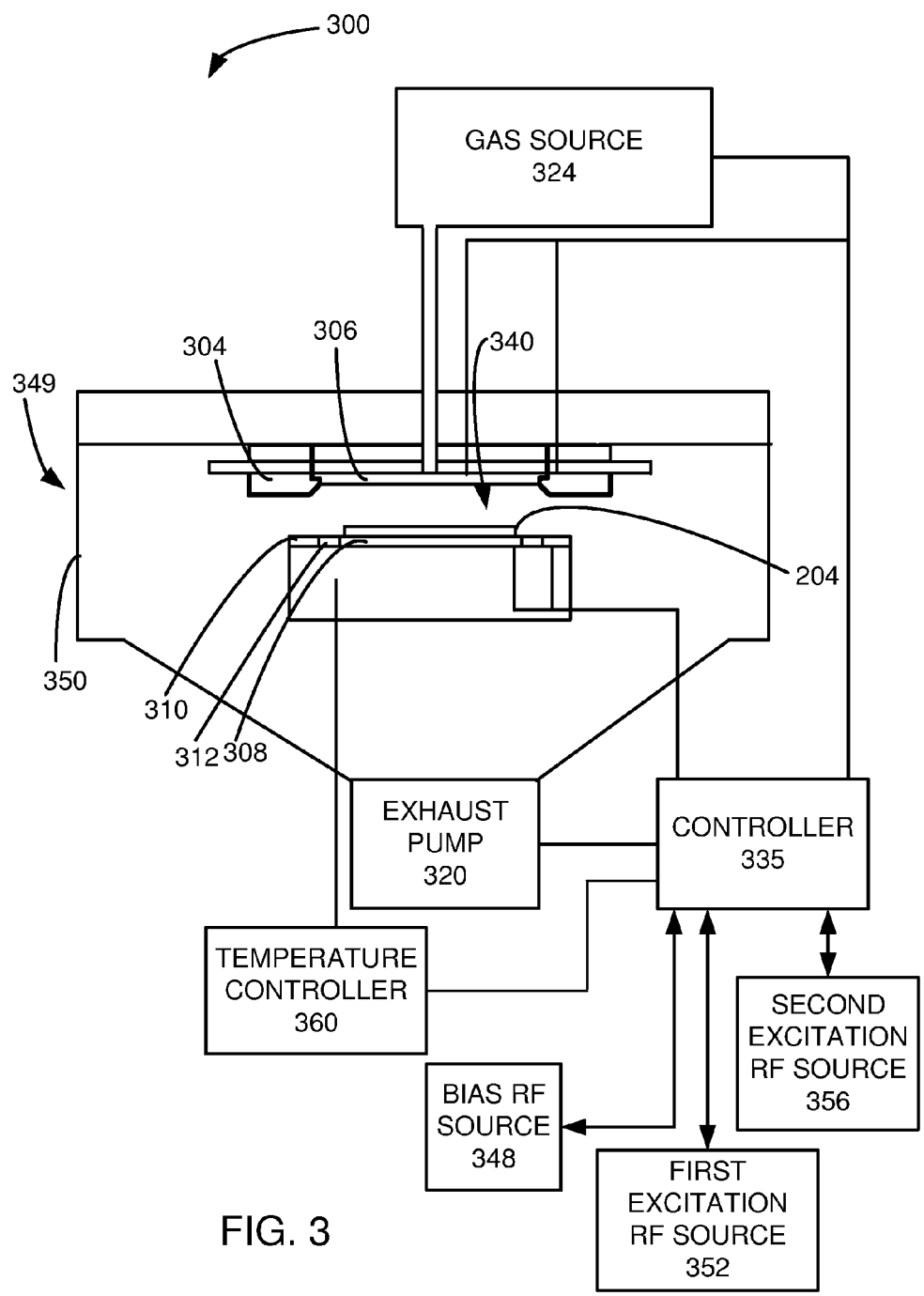
FIG. 3 is a schematic view of an etch reactor that may be used for etching.

The stack 200 is placed in an etch chamber (step 108). FIG. 3 is a schematic view of an etch reactor that may be used in practicing the invention. In an embodiment, an etch reactor 300 comprises a top central electrode 306, top outer electrode 304, bottom central electrode 308, and a bottom outer electrode 310, within a plasma processing chamber 349, enclosed by a chamber wall 350. A bottom insulator ring 312 insulates the bottom central electrode 308 from the bottom outer electrode 310. Also within the plasma processing chamber 349, the substrate 204 is positioned on top of the bottom central electrode 308. The bottom central electrode 308 provides an electrostatic chuck (ESC) for holding the substrate 204. In this embodiment the bottom outer electrode 310 and the top outer electrode 304 have apertures that have a larger diameter than the substrate 204, so that the substrate 204 is positioned within the apertures.

A gas source 324 is connected to the plasma processing chamber 349 and supplies gas into a plasma region 340 of the plasma processing chamber 349 during the etch or open processes.

A bias RF source 348, a first excitation RF source 352, and a second excitation RF source 356 are electrically connected to the plasma processing chamber 349 through a controller 335 to provide power to the electrodes 304, 306, 308, and 310. The bias RF source 348 generates bias RF power and supplies the bias RF power to the plasma processing chamber 349. In this example, the bias RF power has a frequency of 2 MHz. The first excitation RF source 352 generates source RF power and supplies the source RF power to the plasma processing chamber 349. In this example, this source RF power has a frequency of 27 MHz. The second excitation RF source 356 generates another source RF power and supplies the source RF power to the plasma processing chamber 349, in addition to the RF power generated by the first excitation RF source 352. In this example, this source RF power has a frequency of 60 MHz. A temperature controller 360 is connected to control the temperature of the central electrode 308 forming the ESC.

The different RF signals may be supplied to various combinations of the top and bottom electrodes. Preferably, the lowest frequency of the RF should be applied through the bottom electrode on which the material being etched is placed, which in this example is the bottom central electrode 308. In this example, the top electrodes are grounded and power is only provided to the bottom central electrode 308.

The controller 335 is connected to the gas source 324, the temperature controller 360, the bias RF source 348, the exhaust pump 320, the first excitation RF source 352, and the second excitation RF source 356. The controller 335 controls the flow of the etch gas into the plasma processing chamber 349, the chamber pressure, as well as the generation of the RF power from the three RF sources 348, 352, 356, the electrodes 304, 306, 308, and 310, and the exhaust pump 320.

The top central electrode 306 also serves as a gas distribution plate, which is connected to the gas source 324, and serves as a gas inlet for gas from the gas source 324. The exhaust pump 320 serves as a gas outlet removing gas, which passes from the top central electrode 306 through the plasma region 340 through apertures 302 to the exhaust pump 320. The exhaust pump 320 may help to control pressure.

A Flex FL® dielectric etch system made by Lam Research Corporation™ of Fremont, Calif. may be used in a preferred embodiment of the invention. In the Flex EX+ the upper electrodes are grounded.

Figure 4:
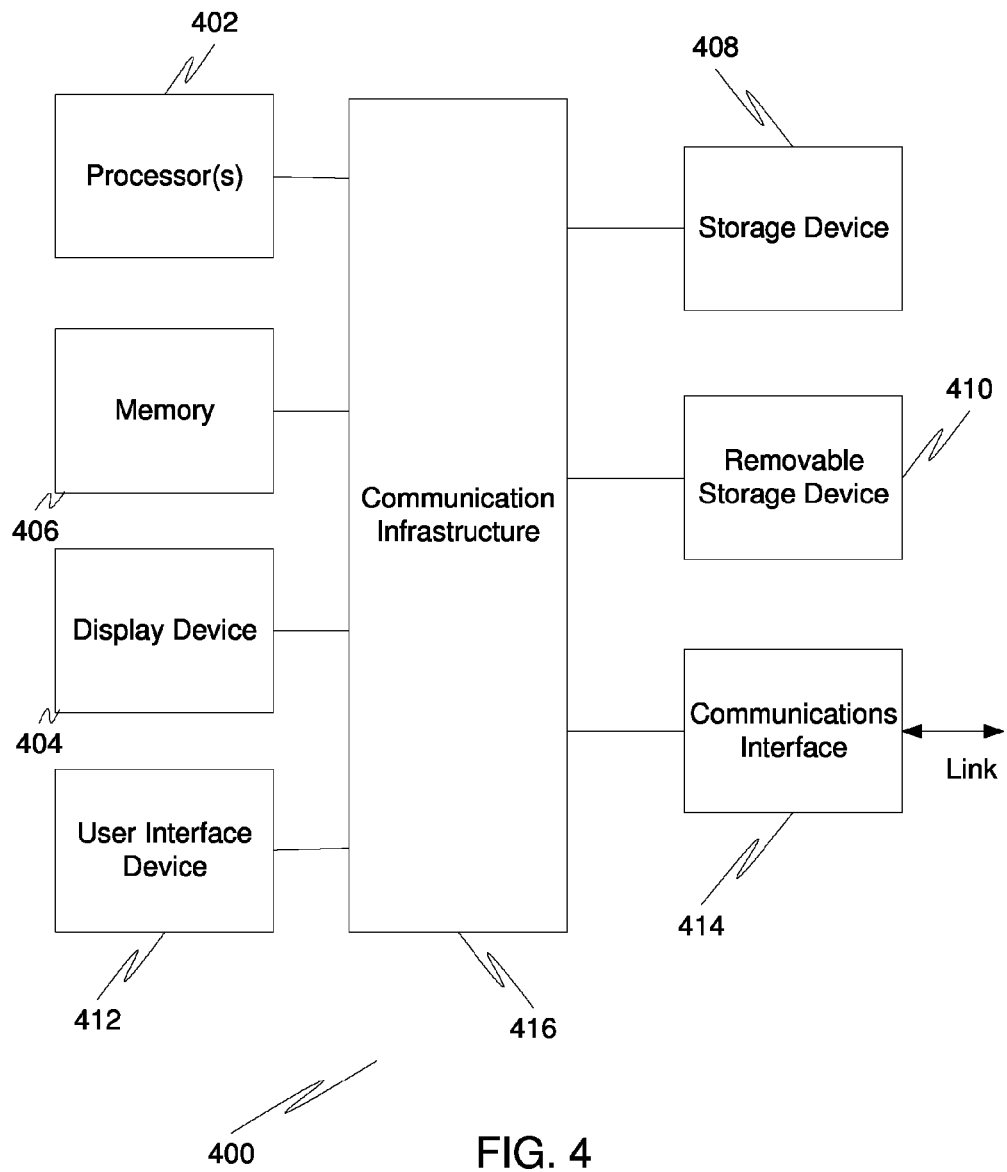
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
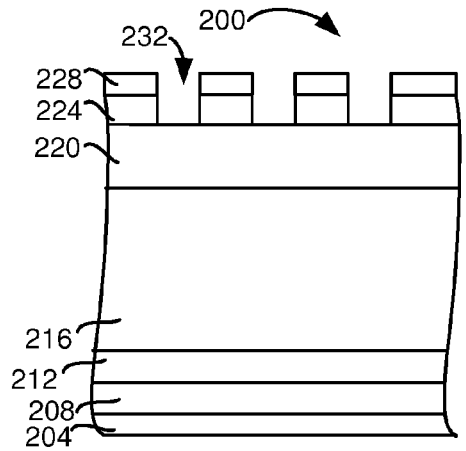

The ARC 224 is opened (step 112). In this embodiment, the ARC is a silicon containing ARC (SiARC). In such an ARC opening process, an ARC opening gases consisting of $C_XF_Y$ ($X \geq 1, Y \geq 1$) such as $C_4F_8$, $CF_4$ along with $O_2$ are flowed from the gas source 324 into the plasma processing chamber 349. The second excitation source 356 provides RF power at 60 MHz. The ESC chuck is placed at a temperature of about 0°–10° C. The etching process transfers opening 232 of the photoresist layer 228 to the unmasked portions of the SiARC layer 224. In this example, no power is provided at 2 MHz and 27 MHz. FIG. 2B is a cross sectional view of the stack 200 after the ARC 224 has been opened (step 112).

Figure 2C:
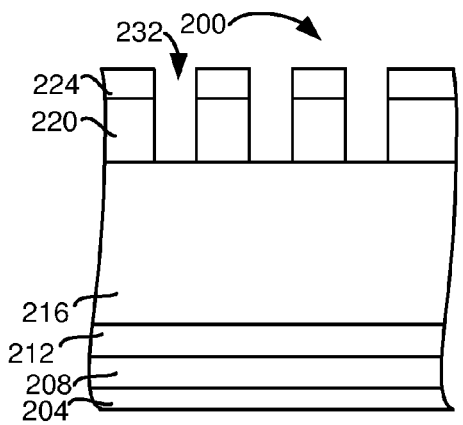

The planarization layer 220 is opened (step 116). In this embodiment the planarization layer 220 is an organic planarization layer (OPL). The pattern is transferred from the patterned mask 228 to the planarization layer 220. FIG. 2C is a cross-sectional view of the stack 200 after the planarization layer 220 is opened (step 116). In this embodiment, the photoresist layer 228 is removed during the opening of the planarization layer 220 (step 116).

Figure 2D:
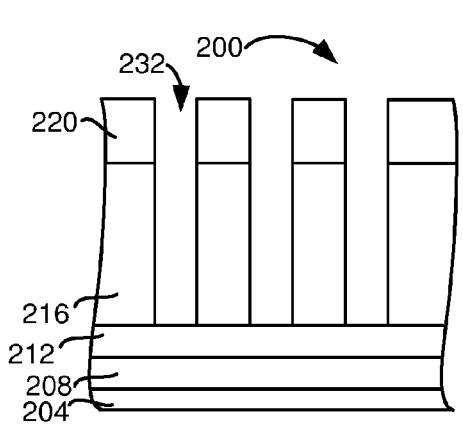

The silicon oxide layer 216 is opened (step 120). In this embodiment, the silicon oxide layer comprises SiO. In such a silicon oxide layer opening process, a silicon oxide opening gas consisting of $C_XF_Y$ ($X \geq 1, Y \geq 1$), such as $C_4F_8$, $O_2$, and an inert gas such as Ar is flowed from the gas source 324 into the plasma processing chamber 349. The second excitation source 356 provides RF power at 60 MHz. The bias RF source provides bias power at 2 MHz. In this example, no power is provided at 27 MHz. The ESC chuck is placed at a temperature of about 50°-110° C. FIG. 2D is a cross-sectional view of the stack 200 after the silicon oxide layer has been opened (step 120). In this embodiment, the ARC is removed during the opening of the silicon oxide layer (step 120).

Figure 2E:
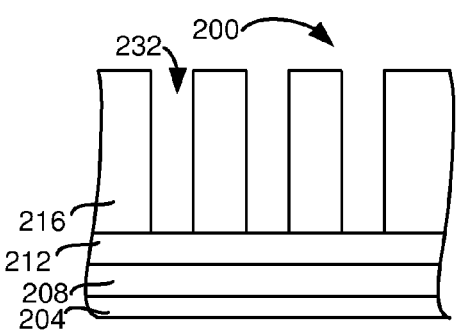

The planarization layer 220 is stripped (step 124). In this embodiment, the organic planarization layer is stripped by flowing oxygen containing gases such as $O_2$ or $CO_2$ from the gas source 324 into the plasma processing chamber 349. The planarization layer removal must be done prior to nitride etch to avoid oxidation of metal layer 208 and the oxygen containing gases in this step removes any polymer deposited on top of nitride layer during the oxide step. The second excitation source 356 provides RF power at 60 MHz. The bias RF source provides bias power at 2 MHz. In this example, no power is provided at 27 MHz. The ESC chuck is placed at a temperature of about 30°–40° C. FIG. 2E is a cross-sectional view of the stack 200 after the planarization layer has been stripped (step 124).

Figure 2F:
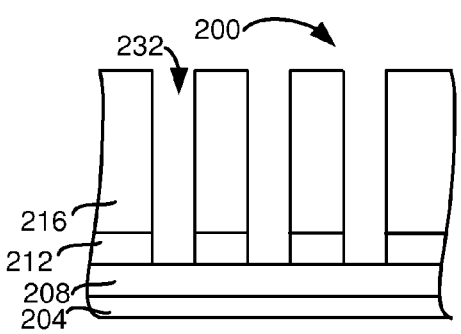
Figure 5:
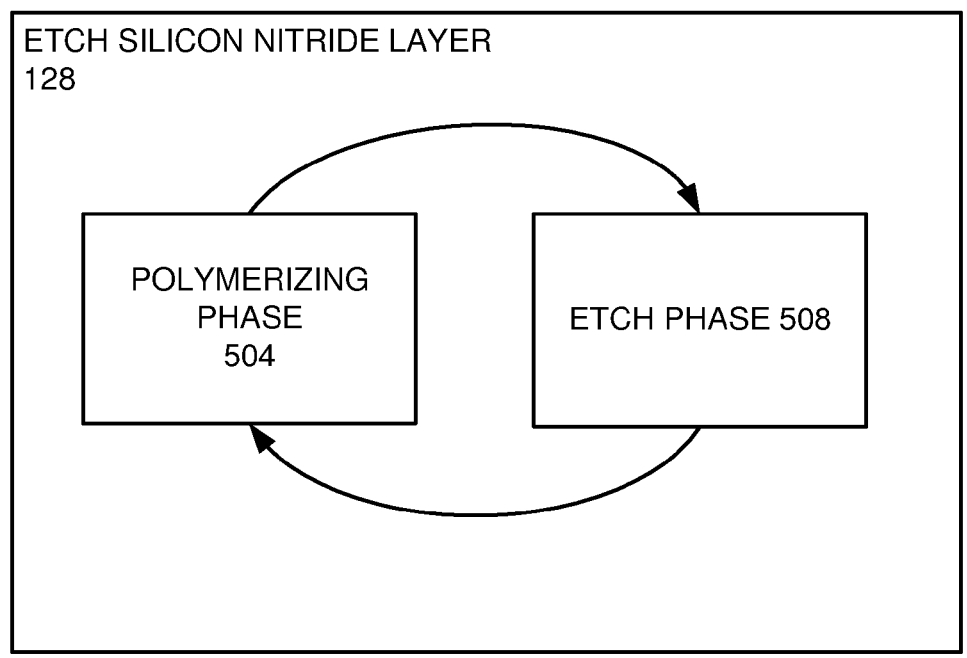
FIG. 5 is a more detailed flow diagram of the step of etching the silicon nitride layer.

The silicon nitride layer 208 is etched (step 128). Since the planarization layer has already been removed, the bulk of oxide is exposed during the nitride etch and hence in this embodiment, it is desirable to minimize the etching of the silicon oxide layer 216. In addition, since the etching of the silicon nitride layer 212 exposes the underlying metal layer 208, this embodiment provides oxygen free etch process. In an example of a recipe for etching SiN, an oxygen free SiN etch gas consisting essentially of either $CF_4$ or $C_XH_YF_Z$ ($X \geq 1$, $Y \geq 1, Z \geq 1$) such as $CH_3F$ and $H_2$ is flowed from the from the gas source into the plasma processing chamber 349. A pulsed bias RF of 100-300 watts at 2 MHz and a pulsed power RF of 100-300 watts at 60 MHz are provided with a pulse duty cycle of 50% and pulse frequency of 100 Hz. The temperature controller 360 maintains the ESC temperature at 0-60° C. FIG. 5 is a more detailed flow diagram of the step of etching the silicon nitride layer 208 (step 128). In this embodiment a polymerizing phase (step 504) is provided, which deposits polymer on the oxide only, when duty cycle does not provide RF power. An etch phase (step 508) is provided, which removes deposited polymer and etches the SiN, when the duty cycle provides RF power. FIG. 2F is a cross-sectional view of the silicon nitride layer 208 has been etched. In other embodiments, the SiN etch gas consists essentially of $CF_4$ and $H_2$.

The stack 200 is removed from the chamber (step 132). In this embodiment, the stack 200 is mounted on an electrostatic chuck in a chamber, and the steps of opening the ARC (step 112), opening the planarization layer (step 116), opening the silicon oxide layer (step 120), stripping the planarization layer (step 124), and etching the silicon nitride layer (step 128) are all performed in situ in the same chamber while mounted on the same electrostatic chuck. The ability to perform these various steps in the same chamber allows for faster and less expensive processing.

This embodiment has been found to provide no more than 5 nm etch loss of silicon oxide, while etching 5 to 60 nm of silicon nitride. The reduction of the silicon oxide etch reduces gate leakage currents between the adjacent features and also minimizes metal void formation, increases aspect ratio, and reduces voids during subsequent metal filling. In addition, this embodiment prevents oxidation of the metal layer 208. Such oxidation would increase electrical resistance of the metal layer. This embodiment also provides an anisotropic etch of the SiN, preventing or reducing undercutting, which reduces voids. This embodiment provides a SiN etch with an aspect ratio of greater than 4:1. This embodiment results in no polymer deposition on the silicon oxide. Other embodiments provide minimal polymer deposition on the silicon oxide. Such minimal polymer deposition may be removed using a standard clean process. This embodiment provides a SiN to SiO etch selectivity of greater than 10:1. This embodiment also minimizes reverse ion etch lag between isolated and dense features.

In this embodiment, for the SiN etch gas the ratio of the flow rate of $H_2$ to the flow rate of $C_XH_YF_Z$ ($X \geq 1, Y \geq 1, Z \geq 1$), such as $CH_3F$, or $CF_4$ is in the range of 40:1 to 2:1. More preferably, for the SiN etch gas the ratio of the flow rate of $H_2$ to the flow rate of $C_XH_YF_Z$ ($X \geq 1, Y \geq 1, Z \geq 1$), such as $CH_3F$, or $CF_4$ is in the range of 30:1 to 7:1. Most preferably, for the SiN etch gas the ratio of the flow rate of $H_2$ to the flow rate of $C_XH_YF_Z$ ($X \geq 1, Y \geq 1, Z \geq 1$), such as $CH_3F$, or $CF_4$ is in the range of 20:1 to 12:1. In other embodiment, other gases may be used be added to the SiN etch gas in addition to $C_XH_YF_Z$ ($X \geq 1, Y \geq 1, Z \geq 1$) or $CF_4$ and $H_2$. In this embodiment, the high frequency RF is preferably between 2 MHz to 100 MHz with a power in the range of 200 to 1000 watts. In this embodiment, the bias RF is in the range of 0.5 MHz to 10 MHz with a power in the range of 200 to 500 watts. Preferably, the SiN etch gas comprises $H_2$ and $C_XH_YF_Z$ ($X \geq 1, Y \geq 1, Z \geq 1$). More preferably, the SiN etch gas comprises $H_2$ and $CH_3F$. Preferably, the SiN etch gas consists essentially of $H_2$ and either $C_XH_YF_Z$ ($X \geq 1, Y \geq 1, Z \geq 1$) or $CF_4$. More preferably, the SiN etch gas consists essentially of $H_2$ and either $C_XH_YF_Z$ ($X \geq 1, Y \geq 1, Z \geq 1$). Most preferably, the SiN etch gas consists essentially of $H_2$ and either $CH_3F$.

Various embodiments provide oxygen free SiN etch that provides high selectivity and an anisotropic SiN etch. The oxygen free etch means that components containing oxygen, such as $O_2$, CO, or $CO_2$ are not provided during the etch of SiN. Various embodiments use RF pulsing and a tunable electrostatic chuck. In an embodiment, the temperature of the electrostatic chuck is used to control the taper of the SiN features. In this embodiment to provide vertical sidewalls for the SiN features the electrostatic chuck is maintained at a temperature in the range of 0° C. to 60° C. In other embodiments, during the etching of SiN features the electrostatic chuck is maintained at a temperature in the range of 30° C. to 40° C. Various embodiments are able to provide etch features with a pitch below 10 nm node. In an embodiment, even though the etching or opening of the silicon oxide layer is performed with an electrostatic chuck temperature of at least 90° C., during the etching or opening of the SiN the electrostatic chuck temperature is lowered to less than 40° C. to provide vertical sidewalls. In other embodiments, the planarization layer is not stripped before etching the silicon nitride layer. In such an embodiment, the planarization layer may be stripped after etching the silicon nitride layer.

The above embodiments may be used to open gate contacts. The metal layers form a gate metal. Other embodiments may have other stacks and other SiN and SiO configurations. For example, SiN spacers may be selectively etched on sides of SiO features. Instead of the metal layer being under the SiN layer, in other embodiments, the metal layer or features are placed in other positions adjacent to the SiN layer, so that during the SiN etch the metal features are exposed to the plasma used for the SiN etch.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for selectively etching silicon nitride with respect to silicon oxide, comprising
    providing an oxygen free silicon nitride etch gas comprising $H_2$ and either $CF_4$ or $C_XH_YF_Z$ ($X \geq 1, Y \geq 1, Z \geq 1$); and
    providing an RF power to form the etch gas into a plasma, wherein the silicon nitride is exposed to the plasma, wherein the RF power is pulsed, wherein the RF pulsing has a duty cycle between 25% to 75% inclusive, wherein during a phase of the duty cycle when RF power is not provided polymer is deposited and when RF power is provided polymer is removed and the silicon nitride is selectively etched with respect to silicon oxide and wherein the etch selectivity of silicon nitride to silicon oxide is greater than 20:1.

2. The method, as recited in claim 1, wherein at least one metal feature is exposed to the plasma.

3. The method as recited in claim 2, further comprising maintaining an electrostatic chuck at a temperature between 0° C. and 60° C., inclusive, to maintain a silicon nitride etch profile.

4. The method, as recited in claim 3, wherein the oxygen free silicon nitride etch gas consists essentially of $H_2$ and either $CF_4$ or $C_XH_YF_Z$ ($X \geq 1, Y \geq 1, Z \geq 1$).

5. The method, as recited in claim 3, wherein the oxygen free silicon nitride etch gas consists essentially of $H_2$ and $CH_3F$.

6. The method, as recited in claim 3, wherein the oxygen free silicon nitride etch gas Comprises $H_2$ and $CH_3F$.

7. The method, as recited in claim 3, wherein the at least one metal feature is a metal layer under the silicon nitride.

8. The method, as recited in claim 3, wherein a stack is formed by the at least one metal feature forming a metal layer under the silicon nitride; forming a silicon nitride layer under the silicon oxide; forming a silicon oxide layer under a planarization layer, under a patterned mask, wherein the method further comprises:
   transferring a pattern from the patterned mask to the planarization layer; and
   transferring the pattern from the planarization layer to the silicon oxide layer, wherein the transferring the pattern from the planarization layer to the silicon oxide layer, comprises maintaining the electrostatic chuck at a temperature of at least 90° C.

9. The method as recited in claim 1, further comprising maintaining an electrostatic chuck at a temperature between 0° C. and 60° C., inclusive, to maintain a silicon nitride etch profile.

10. The method, as recited in claim 1, wherein the oxygen free silicon nitride etch gas consists essentially of $H_2$ and either $CF_4$ or $C_xH_yF_z$ ($X \geq 1$, $Y \geq 1$, $Z \geq 1$).

11. The method, as recited in claim 1, wherein the oxygen free silicon nitride etch gas consists essentially of $H_2$ and $CH_3F$.

12. The method, as recited in claim 1, wherein a stack is formed by a metal layer under the silicon nitride; forming a silicon nitride layer under the silicon oxide; forming a silicon oxide layer under a planarization layer, under a patterned mask, wherein the method further comprises:
   transferring a pattern from the patterned mask to the planarization layer; and
   transferring the pattern from the planarization layer to the silicon oxide layer, wherein the transferring the pattern from the planarization layer to the silicon oxide layer, comprises maintaining the electrostatic chuck at a temperature of at least 90° C.

13. A method for selectively etching silicon nitride with respect to silicon oxide, wherein the silicon nitride is adjacent to metal features, comprising:
   providing an oxygen free silicon nitride etch gas consisting essentially of $H_2$ and $CH_3F$;
   maintaining an electrostatic chuck at a temperature between 0° C. and 60° C., inclusive, to maintain a silicon nitride etch profile; and
   providing a pulsed RF power to form the etch gas into a plasma, wherein the silicon nitride and metal features are exposed to the plasma, wherein the RF power is pulsed, wherein the RF pulsing has a duty cycle between 25% to 75% inclusive, wherein during a phase of the duty cycle when RF power is not provided polymer is deposited and when RF power is provided polymer is removed and the silicon nitride is selectively etched with respect to silicon oxide and wherein the etch selectivity of silicon nitride to silicon oxide is greater than 20:1.

* * * * *